United States Patent
Miki et al.

(10) Patent No.: US 6,420,192 B2
(45) Date of Patent: Jul. 16, 2002

(54) METHOD OF MANUFACTURING SEMICONDUCTOR MEMORY

(75) Inventors: Hiroshi Miki, Shinjuku-ku; Keiko Abdelghafar, Kodaira; Yoshihisa Fujisaki, Fuchu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/968,921

(22) Filed: Oct. 3, 2001

Related U.S. Application Data (62) Division of application No. 09/214,382, filed as application No. PCT/JP97/02322 on Jul. 4, 1997, now Pat. No. 6,309,894.

(30) Foreign Application Priority Data

Jul. 9, 1996 (JP) .............................. 8-178907

(51) Int. Cl.$^7$ ................................. H01G 7/06
(52) U.S. Cl. ........................................ 438/3; 438/240
(58) Field of Search ........................ 438/3, 240, 238, 438/250–256, 381, 393–399

(56) References Cited

U.S. PATENT DOCUMENTS

| | | | |
|---|---|---|---|
| 5,568,352 A | * | 10/1996 | Hwang ...................... 29/25.42 |
| 5,909,043 A | * | 6/1999 | Summerfelt | |

FOREIGN PATENT DOCUMENTS

| | | | |
|---|---|---|---|
| JP | 6-1365 | * | 1/1994 |
| JP | 7-263570 | * | 10/1995 |
| JP | 8-55967 | * | 2/1996 |

OTHER PUBLICATIONS

K. Koyama, et al., "A Stacked Capacitor with (Ba$_x$Sr 1-x)TiO$_2$ for 256M DRAM", IEEE Int'l Electron Device Meeting, pp. 823–826 (1991).*

N. Tanabe, et al., "A Ferroelectric Capacitor over Bit–Line (F–COB) Cell for High Density Nonvolatile Ferroelectric Memories", 1995 Symposium on VLSI Technology Digest of Technical Papers, pp. 123–124.*

Hase, et al., "Analysis of the Degradation of PT and SrBi$_2$ Ta$_2$ O$_9$ Thin Films with a Reductive Process", 8$^{th}$ Int'Symposium on Integrated Ferroelectrics, 11c(1996).*

Maniar, et al., "Impact of Backend Processing on Integrated Feroelectrics Capacitor Characteristics", Material Research Society Symposium Proceedings, vol. 310, pp. 151–156 (1993).*

* cited by examiner

Primary Examiner—Jey Tsai
(74) Attorney, Agent, or Firm—Antonelli, Terry, Stout & Kraus, LLP (57) ABSTRACT

A semiconductor memory which is improved in reliability by preventing the lowering of capacitance and defective insulation, especially, electrode delamination. The semiconductor memory has an integrated capacitor composed of a capacitor structure constituted of an upper electrode, a lower electrode, and a capacitor insulating film (of a high-dielectric-constant or ferroelectric thin film) which is held between electrodes and serves as a capacitor insulating film, and a protective insulating film which covers the capacitor structure and is formed by plasma treatment after electrode formation. An oxygen introducing layer is formed on the surface of the capacitor insulating film. The oxygen introducing layer can be formed on the surface of the high-dielectric-constant or ferroelectric material by introducing oxygen to the boundary between the electrode and the material by conducting heat treatment in an oxygen atmosphere before the protective insulating film (SiO$_2$ passivation film) is formed.

8 Claims, 9 Drawing Sheets

METHOD OF MANUFACTURING SEMICONDUCTOR MEMORY

This application is a Divisional application of application Ser. No. 09/214,382, U.S. Pat. No. 6,309,894 filed Jan. 6, 1999, which is a national stage application filed under 35 USC 371 of International application No. PCT/JP97/02322, filed Jul. 4, 1997.

BACKGROUND OF THE INVENTION

1. Field of the Invention

This invention relates to a semiconductor memory and method of manufacturing a semiconductor memory, and in particular, to a semiconductor memory and method of manufacturing such a memory using a thin film of high-dielectric-constant or ferroelectric material as a capacitor insulator for a storage capacitor.

The term high dielectric constant or ferroelectric material thin film refers to a high-dielectric-constant or ferroelectric thin film forming the capacitor insulator, and capacitors using these insulating thin films are referred to by the general name of high-dielectric-constant or ferroelectric thin film capacitors as described in detail hereafter.

2. Prior Art

Semiconductor memory capacitors using high-dielectric-constant materials as capacitor insulating films are now being considered for use in applications requiring high electrostatic capacitances of small surface area, in particular large-scale DRAM, due to the fact that they have a higher electrostatic capacitance per unit surface area than a capacitor using a conventional insulating film such as a silicon oxide film or silicon nitride film.

For example, according to "IEEE International Electron Device Meeting pp.823–826 (1991)", there have been reports of using (Ba, Sr)TiO$_3$ (abbreviated hereafter as BST) as a high ferroelectric material.

Capacitors of identical structure using ferroelectric materials as capacitor insulating films are also being considered for use as large-scale, non-volatile memories. For example, according to "1995 Symposium on VLSI Technology Digest of Technical Papers, pp.123–124", has mentioned the use of Pb(Zr, Ti)O$_3$ (referred to hereafter as PZT) as a ferroelectric material. The electrode material in these cases was a noble metal, Pt, as in the case of BST.

When semiconductor memories using these materials are manufactured, after manufacturing the capacitor, an interconnecting layer which makes electrical connection to this capacitor, and an interconnecting layer relating to peripheral circuit parts which perform electrical conversions between the memory cells and the outside of the memory chip, are formed. An insulating film must be formed to provide electrical insulation between these interconnecting layers and between these interconnecting layers and the capacitor, and this process must be performed in a reducing or slightly oxidizing atmosphere to avoid deterioration of the interconnecting layers. However, the capacitor is known to suffer considerable damage as a result of this process.

For example, according to "Material Research Society Symposium Proceedings, Vol. 310, pp.151–156 (1993)", it is reported that PZT which is a ferroelectric material loses its ferroelectricity and leakage current increases when an SiO$_2$ film is formed by CVD as an inter-layer insulating film.

Further, in the memory manufacturing process, annealing in a hydrogen atmosphere is carried out as a final step to ensure reliability of the metal interconnection layer and the transistor formed in the layer below the capacitor. This hydrogen treatment is known to have an effect on capacitor characteristics as in the case of the inter-layer insulating film forming step.

For example, according to "8th International Symposium on Integrated Ferroelectrics, 11c (1996)", when SrBi$_2$Ta$_2$O$_9$ (referred to hereafter as SBT) is used as a ferroelectric material, there is considerable deterioration of ferroelectricity when treatment in a hydrogen atmosphere is performed, and attempts have been made to repair the damage due to this hydrogen treatment by annealing in an oxygen atmosphere.

However, it was found that there are problems in applying the above methods to an actual manufacturing process, i.e.:

(1) The materials used for the metal interconnection formed after the capacitor manufacturing step, such as aluminum, etc., are not resistant to the high temperature oxidizing atmosphere.

(2) In the oxygen annealing of the following step, the oxygen concentration decreases due to the thickness of the inter-layer insulating film, and recovery from damage is also less. According to experiments carried out by the inventor, if hydrogen treatment has been carried out to ensure reliability of the transistor, capacitor characteristics do not recover sufficiently once they have deteriorated even if annealing is subsequently performed in oxygen, and repair is difficult.

One type of deterioration is capacitor delamination (delamination of the upper electrode from the capacitor insulating layer). Due to this phenomenon, in the manufacture of large-scale memories which employ a considerable amount of fine interconnections, all products in the same manufacturing lot become defective, yield declines and reliability drastically decreases.

In addition to the above problems, it was found that compared to capacitors which have not been treated, capacitors treated in a hydrogen atmosphere suffer considerable degrading of electrical characteristics due to voltage stress and alternating electric field stress, and there are serious problems with regard to their reliability.

Japanese Published Unexamined Application No. Hei 8-55967 (published on Feb. 27, 1996) which relates to a method of manufacturing a ferroelectric thin film capacitor, discloses how leakage current is reduced by annealing oxygen vacancies in the ferroelectric thin film (in an oxidizing atmosphere). However, no mention is made of the problem of electrode delamination.

SUMMARY OF THE INVENTION

It is therefore an object of this invention to resolve the above problems, and in particular, to provide a semiconductor memory comprising a capacitor having low leakage current, high capacitance and high remnant polarization, and a method of manufacturing such a memory.

To achieve the above objects, as a result of various experiments carried out to study degrading of capacitor characteristics, the inventor found the main cause to be a structural transformation in the vicinity of the boundary between the upper electrode and the high-dielectric-constant or ferroelectric material functioning as the capacitor insulating film, in particular the production of oxygen vacancies on the surface of the metal oxide which is the high-dielectric-constant or ferroelectric material. It was found that a large number of these oxygen vacancies were present at the boundary between the upper electrode (formed after the high-dielectric-constant or ferroelectric thin film) and the high-dielectric-constant or ferroelectric thin film. It was also found that deterioration of adhesive properties between the noble metal of the upper electrode and the high-dielectric-constant or ferroelectric material (delamination of upper electrode) was strongly correlated with this oxygen vacancy concentration.

The inventor attempted to actively oxidize the high-dielectric-constant or ferroelectric material-electrode boundary after forming the capacitor electrodes (particularly the upper electrode). As a result, degradation and delamination were suppressed in the step for forming the insulating film of the high-dielectric-constant or ferroelectric material capacitor, which is the subsequent step, and long-term reliability was improved. In other words, it was confirmed that carrying out oxygen treatment before hydrogen treatment after forming the capacitor was extremely effective compared to the prior art method of performing hydrogen treatment after forming the capacitor.

This invention, which was conceived on the basis of the above observations, therefore provides a semiconductor memory comprising an integrated capacitor having a structure comprising an upper electrode, lower electrode and high ferroelectric oxide thin film which functions as a capacitor insulating film held between these electrodes, and a protective insulating film formed by plasma treatment covering this capacitor structure, wherein a layer with additional oxygen is formed on the surface of the high ferroelectric oxide thin film functioning as the capacitor insulating film.

DESCRIPTION OF THE PREFERRED EMBODIMENTS

This invention will now be described in detail referring to the drawings.

Figure 1:
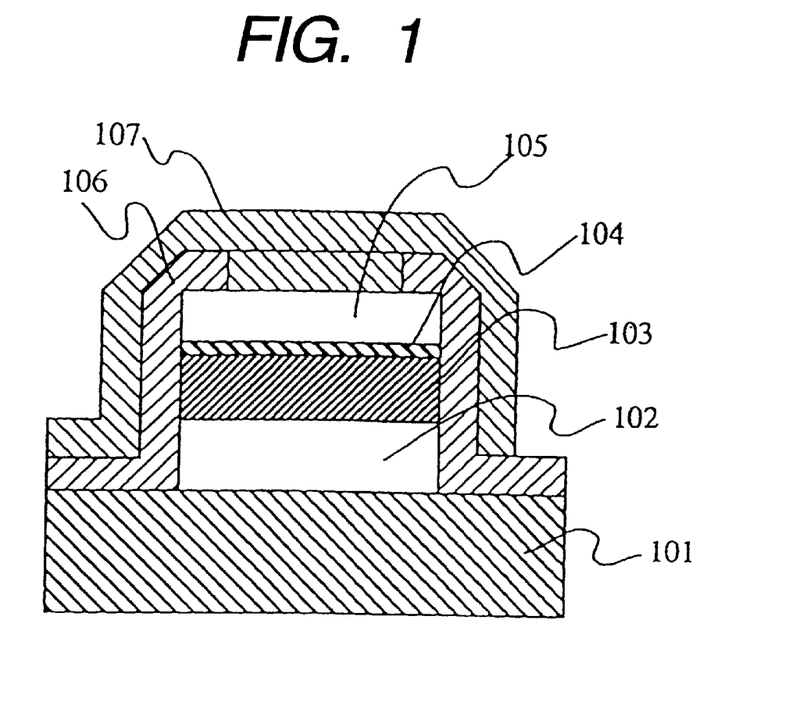
FIG. 1 is a sectional view showing an example of a capacitor functioning as a storage capacitance of a semiconductor memory according to this invention.

FIG. 1 is a section through the essential parts of a capacitor functioning as a storage capacitance of a semiconductor memory. First, a lower electrode 102, capacitor insulating film 103 (of a high-dielectric-constant or ferroelectric material), layer 104 with additional oxygen on the surface of this capacitor insulating film 103 and upper electrode 105 are formed on a semiconductor substrate 101 comprising a functional device such as a transistor, and the capacitor comprising these upper/lower electrodes and ferroelectric material is covered by a protective film 106, which is an inter-layer insulating film.

An opening is formed by a suitable etching process in a part of this protective film 106 so that a metal interconnection 107 is electrically conducting to the upper electrode 105 of the capacitor.

The layer 104 with additional oxygen refers to a layer formed when the upper electrode 105 is formed by fully repairing a layer with a minute oxygen vacancy, produced on the surface of the high-dielectric-constant or ferroelectric thin film functioning as the capacitor insulating film 103, by annealing in an oxygen atmosphere as described hereafter.

The electrode material of the lower electrode 102 and upper electrode 105 is typically platinum, but metal materials comprising for example palladium, nickel, tungsten, titanium and molybdenum as principal components, either alone or in the form of their alloys, or metal oxides or the like with electrical conductivity, may also be used.

The high-dielectric-constant or ferroelectric thin film which functions as the capacitor insulating film 103 may for example be a ferroelectric thin film comprising an oxide having at least one of the metals lead, bismuth, strontium and barium as its main component. Typical examples of ferroelectric thin films are lead titanate-zirconate (Pb(Zr, Ti)O$_3$) abbreviated as PZT and PLZT in which this is doped with La, lead titanate (PbTiO$_3$), strontium-bismuth tantalate (SrBi$_2$Ta$_2$O$_9$) abbreviated as SBT, and bismuth titanate (Bi$_4$Ti$_3$O$_{12}$).

Typical examples of high-dielectric-constant or ferroelectric thin films are barium-strontium titanate ((Ba, Sr)TiO$_3$) abbreviated as BST, strontium titanate (SrTiO$_3$), and barium titanate (BaTiO$_3$).

The protective film 106 which is the inter-layer insulating film may for example be SiO$_2$ or Si$_3$N$_4$ which are normally used as inter-layer insulating films for LSI.

Figure 2:
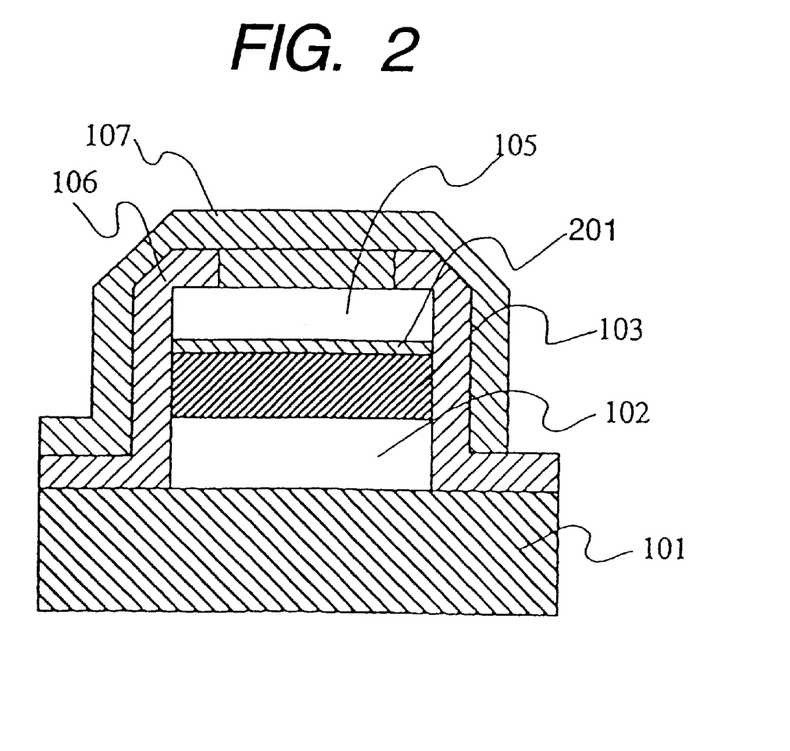
FIG. 2 is a sectional view of a capacitor according to the prior art.
Figure 3:
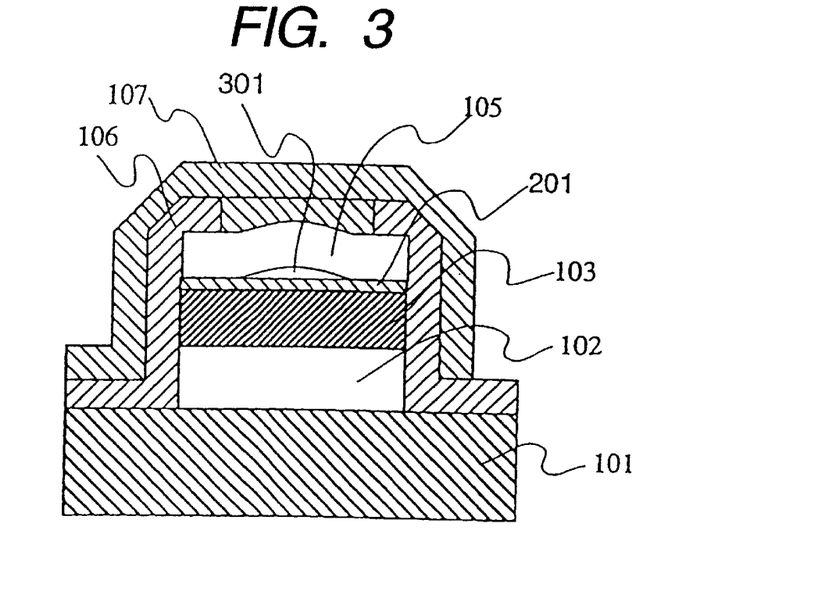
FIG. 3 is a sectional view showing a defect of the capacitor according to the prior art.

For comparison, sectional views of an integrated capacitor manufactured by a prior art process not according to this invention are shown in FIG. 2 and FIG. 3. As shown in FIG. 2, there is no step to introduce additional oxygen, and a layer 201 with oxygen vacancy is produced at the boundary between the upper electrode 105 and the high-dielectric-constant or ferroelectric material 103. Also as shown in FIG. 3, a delaminating part 301 is produced at the boundary between the upper electrode 105 and the high-dielectric-constant or ferroelectric material 103 when the SiO2 protective film 106 is formed or due to hydrogen treatment after forming the capacitor, and the upper electrode 105 often falls off due to delamination.

Figure 4:
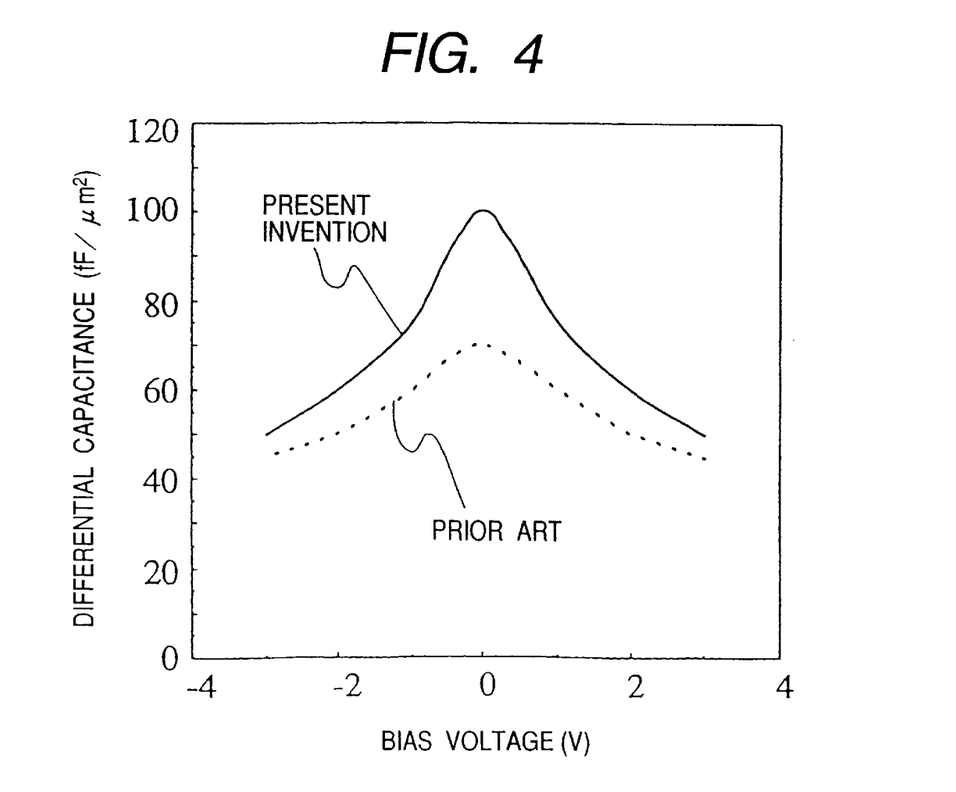
FIG. 4 shows CV characteristic comparison curves for the capacitor according to this invention and the capacitor according to the prior art.

The way in which this layer 201 with oxygen vacancy is repaired by the layer 104 with additional oxygen will first be shown from the initial electrical characteristics. FIG. 4 shows a comparison of differential capacitance-bias voltage characteristics (abbreviated hereafter as CV characteristics) of an integrated capacitor using a high-dielectric-constant material, e.g. BST, as ferroelectric material.

When the layer 201 with oxygen vacancy is repaired by this invention, the voltage drop in the layer with oxygen vacancy is reduced, so the effective dielectric constant in the memory operating voltage region at 1V or less is improved. In FIG. 4, the characteristics shown for this invention relate to the case where the layer 104 with additional oxygen is formed by oxygen treatment (annealing in an oxygen atmosphere), and the characteristics shown for the prior art are those where the upper electrode 105 is formed without performing hydrogen treatment or oxygen treatment. Moreover, if hydrogen treatment is carried out as according to the prior art and oxygen treatment is carried out afterwards, the deterioration is even worse than the prior art characteristic curve shown here.

Figure 5:
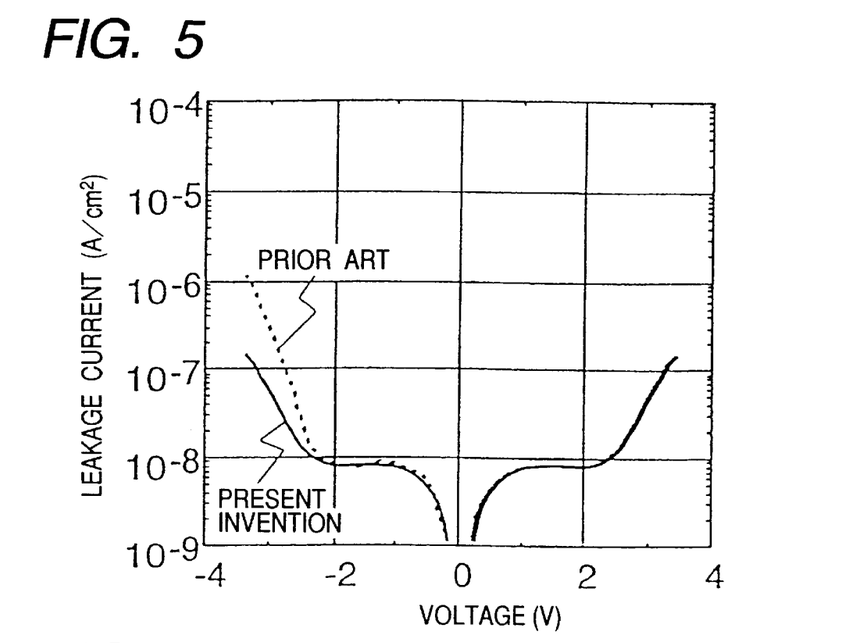
FIG. 5 shows IV characteristic comparison curves for the capacitor according to this invention and the capacitor according to the prior art.

FIG. 5 shows a comparison for leakage current-voltage characteristics (referred to hereafter as IV characteristics). The height of the energy barrier to electrons at the boundary between the upper electrode and high-dielectric-constant or ferroelectric material leads to a reduction of leakage current value on the negative potential side which is a current limiting mechanism, and an integrated capacitor with enhanced insulating properties is thereby formed due to the layer with additional oxygen.

When the ferroelectric material PZT is used as the capacitor insulating film 103, an improved history curve of electric flux density-electric field characteristics (abbreviated hereafter as hysteresis characteristics) is observed. In the case of this invention, the coercive electric field which is a threshold value electric field producing remnant polarization decreases, the remnant polarization increases and more stable operation of the non-volatile memory is obtained.

Next, the effect of this invention on long-term reliability will be demonstrated.

The improvement of initial characteristics of the integrated capacitor was described in the previous section. It would appear that there are some cases where, depending on the required memory specification, usable initial characteristics can still be obtained without this invention even if performance is low. However as regards long-term reliability and particularly during operation where the applied voltage polarity is reversed at high speed, it was found that there was a strong time-dependent fluctuation of dielectric constant and leakage current so that practical operation was impossible.

Figure 6:
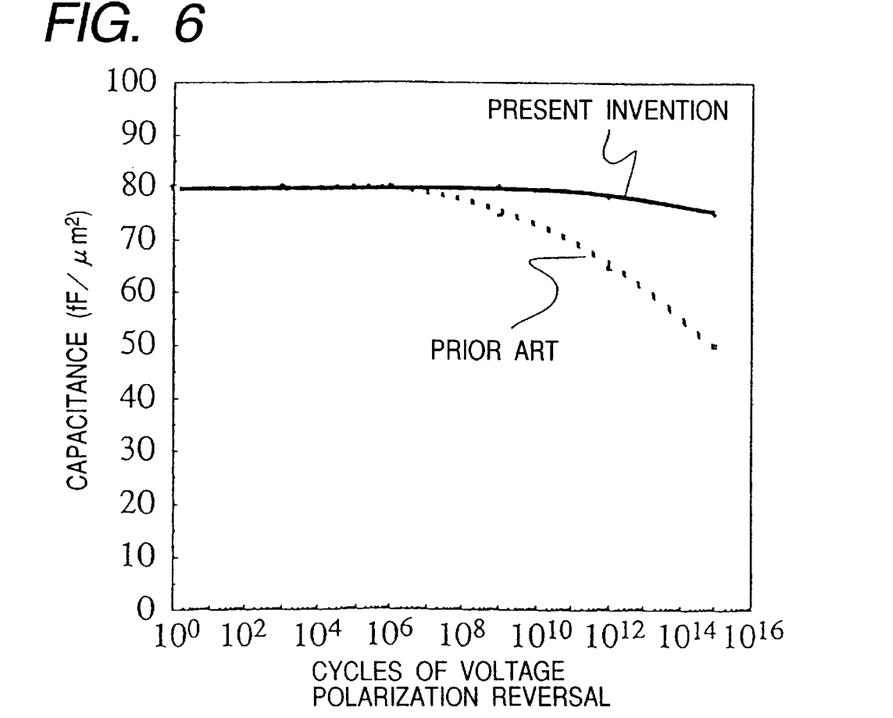
FIG. 6 shows characteristic curves of electrostatic capacitance variation due to alternating electric field stress of the capacitor according to this invention and the capacitor according to the prior art.

In addition to improving initial characteristics,, this invention also suppresses time-dependent fluctuations. FIG. 6 shows a comparison of this invention with the prior art relating to time-dependent variation of electrostatic capacitance of a BST capacitor when an alternating electric field is applied. As is seen in the figure, in the capacitor according to this invention, growth of an oxygen vacancy region which is produced at the boundary between the electrode and high-dielectric-constant or ferroelectric material which is due to alternating electric field stress, is suppressed. Consequently the oxygen vacancy region does not often occur, and time-dependent variations of electrostatic capacitance are reduced.

Figure 7:
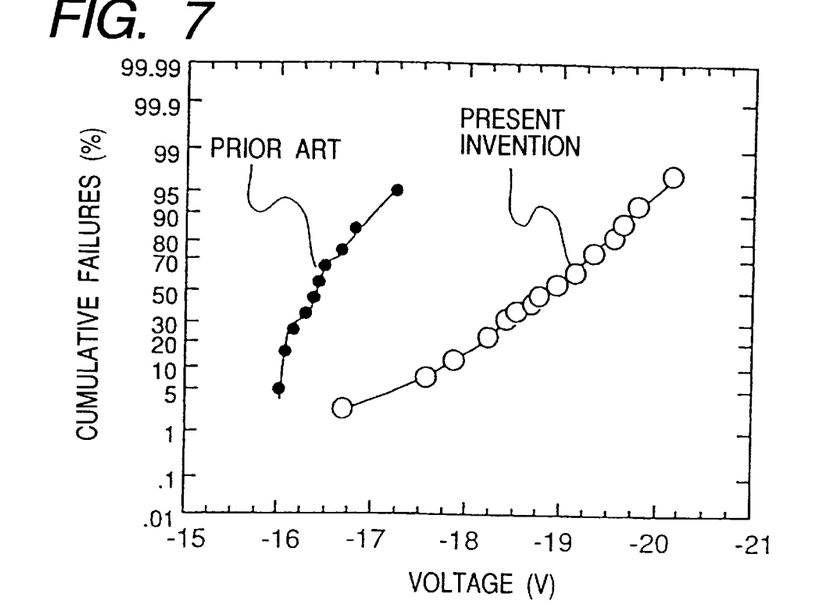
FIG. 7 shows breakdown voltage distribution characteristics after alternating electric field stress of the capacitor according to this invention and the capacitor according to the prior art.

FIG. 7 shows the time-dependent characteristics of the breakdown voltage cumulative failure rate when the same alternating electric field is applied. In the capacitor according to this invention, the cumulative failure rate is suppressed. It is probable that suppressing generation of the oxygen vacancy region also suppresses breakdown voltage failures due to this region, and the failure rate therefore decreases.

As shown by the comparison example in FIG. 3, the production of a delamination region 301 at the boundary between the upper electrode and the high-dielectric-constant or ferroelectric material when the $SiO_2$ protective film 106 is formed or when hydrogen treatment is performed after forming the metal interconnection 107, leads to a reduced product yield and production line throughput which do not meet practical needs. However, it is seen that in the capacitor according to this invention, this delamination is adequately suppressed.

When the reason for this was analyzed, it was found that the region with lower oxygen concentration due to the formation of the protective $SiO_2$ film or to hydrogen treatment after forming the metal interconnection, is concentrated mainly at the boundary between the upper electrode and the high-dielectric-constant or ferroelectric material film, and the decrease of oxygen concentration leads to loss of adhesion at the boundary between the upper electrode and high-dielectric-constant or ferroelectric material. Hence, it may be conjectured that the suppression of delamination by this invention is due to that fact that introducing oxygen into the boundary between the upper electrode 105 and the high-dielectric-constant or ferroelectric material 103 not only suppresses generation of the oxygen vacancy region, but also improves adhesion between the upper electrode 105 and high-dielectric-constant or ferroelectric material 103.

Embodiment 1

A method for manufacturing the integrated capacitor comprising the layer 104 with additional oxygen shown in FIG. 1 will now be described in detail. First, a platinum film which was to be the lower electrode 102 of the capacitor was formed by sputtering on a substrate 101 comprising an electric field effect transistor formed by the usual method. The film thickness was 100 nm.

Next, PZT was deposited to 100 nm thickness as the capacitor insulating film 103 by reactive sputtering in an oxygen atmosphere on this electrode 102. The pressure during the deposition was 0.5 Torr, and the substrate temperature was room temperature. This structure was rapidly oxidized for 30 seconds at 650° C. at normal pressure to crystallize the PZT.

Platinum was further deposited by sputtering to 50 nm on this PZT 103 to form the upper electrode 105. Subsequently, using a mask formed by an ordinary photolithography process, the capacitor was divided by sputter etching into microregions corresponding to memory cells, and a capacitor structure having three layers Pt/PZT/Pt was thereby obtained.

However, it was found that the oxygen deficient layer 201 shown in FIG. 2 had already been formed at the boundary between the upper electrode (Pt) 105 and PZT 103, i.e. on the surface of the PZT, and that adhesion was insufficient.

Oxygen annealing was therefore performed in this state in an electric furnace having a horizontal quartz tube. The oxygen annealing conditions were 30 minutes oxidation at 500° C. in an oxygen atmosphere at ordinary pressure.

Figure 8:
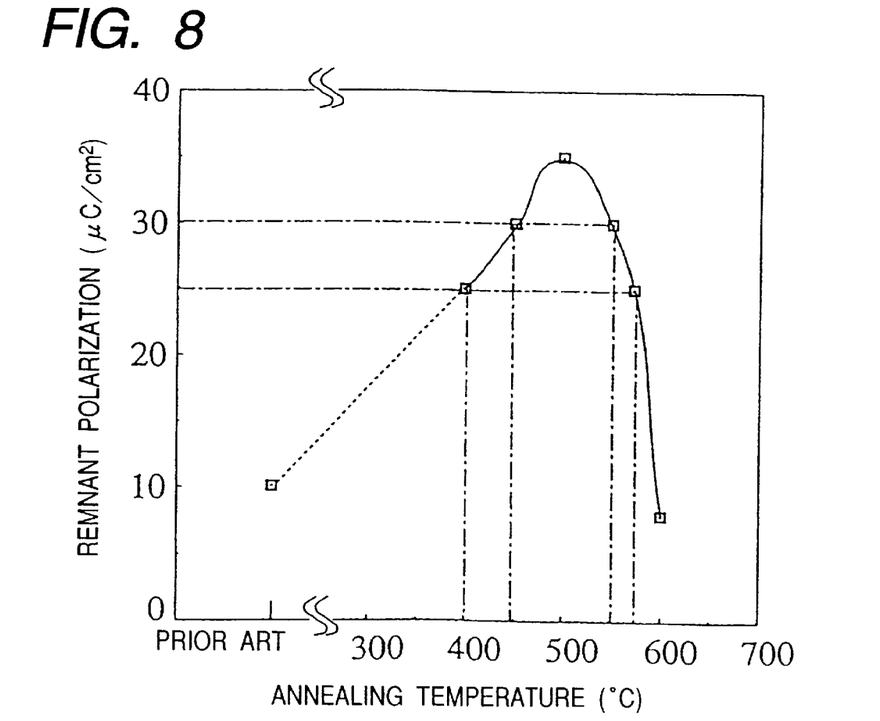
FIG. 8 is a characteristic diagram showing temperature dependence of an oxygen treatment effect according to this invention.

FIG. 8 shows the variation of remnant polarization when 3V was applied in the case where, due to the production of a significant layer with deficient oxygen immediately after depositing the upper platinum, the Pt/PZT/Pt structure did not exhibit sufficient ferroelectricity and was therefore subjected to oxygen annealing as described above. As shown in the figure, sufficient remnant polarization was detected by performing oxygen annealing at 400–575° C. On the other hand, a decrease of remnant polarization was observed at annealing temperatures of 600° C. or more. This shows that the preferred annealing temperature is 450–550° C., and more preferably 500° C.

Figure 9:
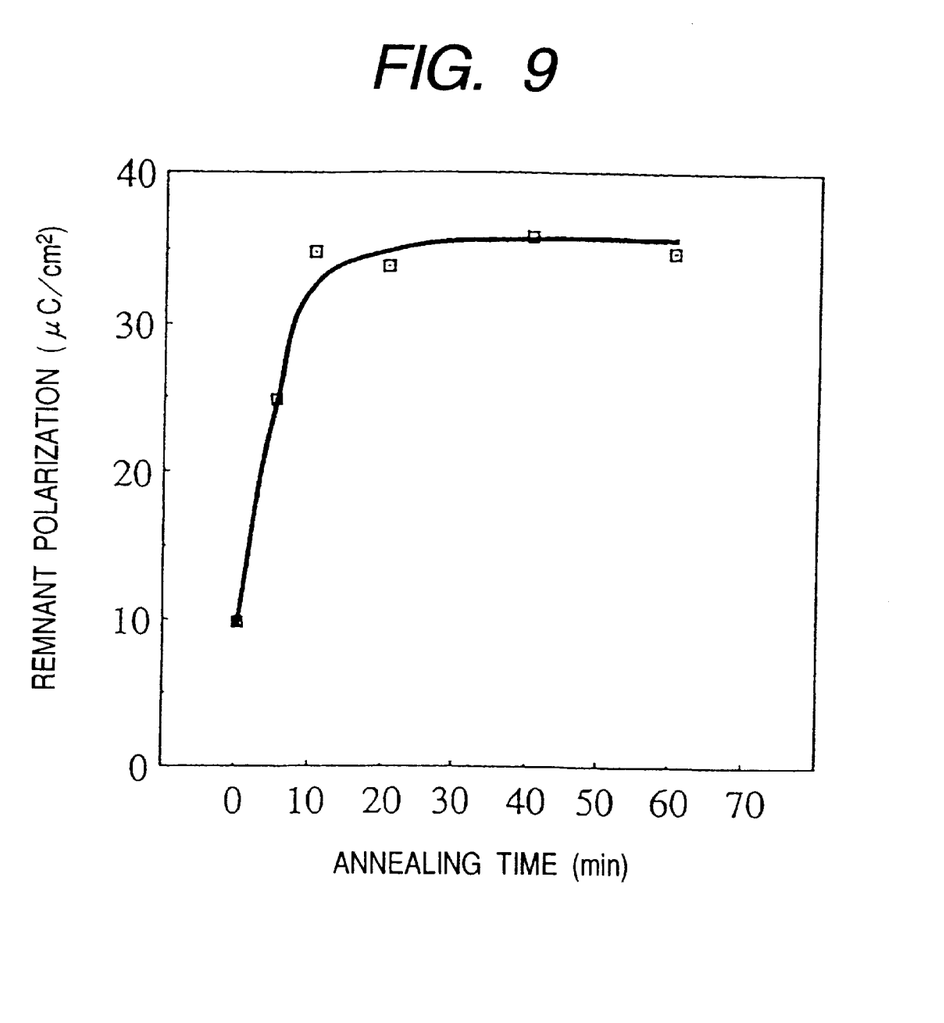
FIG. 9 is a characteristic diagram showing time dependence of an oxygen treatment effect according to this invention.

FIG. 9 shows the variation of remnant polarization with oxygen annealing time at 500° C. It is seen that an annealing step of about 10 minutes is effective. An important point here, although limited to the case of this integrated capacitor structure, is that apart from this advantage of the invention, damage to the high-dielectric-constant or ferroelectric material 103 which is exposed on the sidewall is also repaired by oxygen annealing. Specifically, the construction of the invention shown in FIG. 1 not only solves the problem of the layer with oxygen vacancy at the upper electrode/high-dielectric-constant or ferroelectric material boundary, but also repairs damage on the sidewall of the high-dielectric-constant or ferroelectric material.

By subjecting the upper platinum film to a photolithography step and performing oxygen treatment after dividing the capacitor, delamination due to stress when the substrate temperature is raised, is also suppressed.

Figure 10:
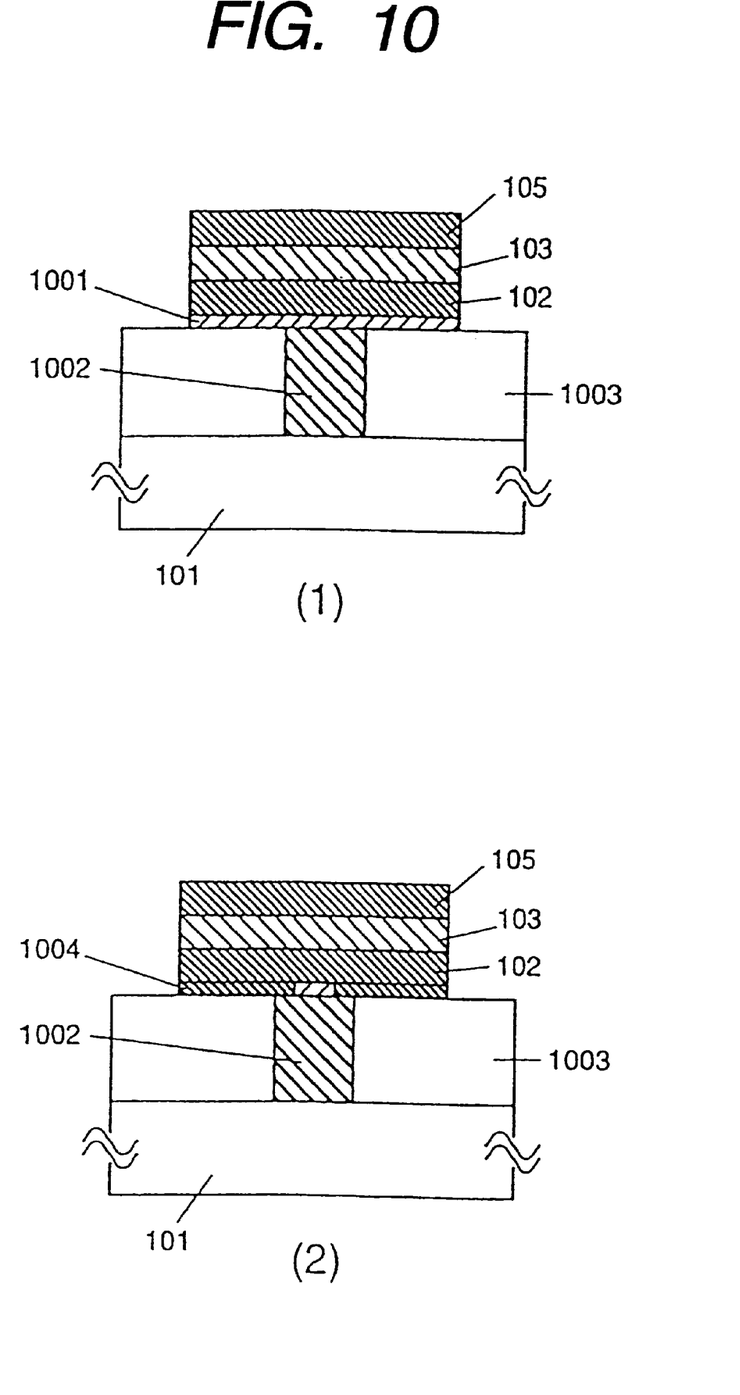
FIG. 10 is a drawing showing a sectional view and an oxidation state in a case where a material having poor oxidation resistance is contained in the upper surface of a cell structure.

Further, when the capacitor is divided into memory cells according to a memory cell structure, it is possible that a material with poor oxidation resistance, e.g. titanium nitride, which is used to connect to the transistor in the lower layer substrate 101, may be exposed. FIG. 10 shows a sectional view where the capacitor is divided into memory cells.

FIG. 10(1) shows titanium nitride 1001 prior to oxidation, and in FIG. 10(2), the exposed periphery of the titanium nitride 1001 is oxidized to form a high resistance layer 1004. Due to the damage caused by capacitor processing, the titanium nitride 1001 which has an exposed periphery does not retain the usual oxidation resistance of titanium nitride, and annealing in an oxygen atmosphere is difficult. In this figure, 1002 is a connection plug to the silicon expansion layer (herein, polysilicon), and 1003 is an inter-layer insulating film ($SiO_2$)To To resolve this problem, it is effective to perform oxygen annealing before etching of the platinum film which becomes the lower electrode 102, or when etching has already been carried out to some extent but the sidewall of the lower titanium nitrate layer 1001 is not yet exposed.

Hence, this invention may be applied at various points in time depending on the structure of the memory cells. The advantage of this invention is obtained in principle by performing the oxygen annealing step after forming the upper electrode 105 but before the passivation step (formation of the inter-layer insulating film 106), and it may be applied to all memory cell structures.

Moreover, as described in the above example, the invention is also effective in eliminating damage due to capacitor processing steps, and it is therefore even more desirable to apply it after processing is completed.

Embodiment 2

Next, another embodiment will be described where the layer 104 with additional oxygen is formed on the surface of the capacitor insulating film by a method other than annealing in an oxygen atmosphere.

The essential feature this invention is to introduce oxygen into the boundary between the upper electrode and the high-dielectric-constant or ferroelectric material. Another effective method of doing this is to actively include oxygen in the upper electrode (in this case platinum) 105 so as to introduce oxygen into the boundary.

Specifically, platinum in the upper electrode 105 is deposited on the high-dielectric-constant or ferroelectric material by sputtering in oxygen. This was done for example by direct current sputtering in an argon atmosphere (200 mTorr) to which 10% oxygen was added.

A platinum film formed by the usual pure argon sputtering is strongly oriented in the (111) direction and the size of the particles is of the same order as that of the film thickness, however a platinum film sputtered in a pure oxygen atmosphere comprises microparticles and loses practically all f its orientation in the (111) direction. In other words, crystal properties are extremely poor. On the other hand, it was found that adhesion to the high-dielectric-constant or ferroelectric material is very much improved. In a delamination test using adhesive tape, a platinum film on a high-dielectric-constant or ferroelectric thin film grown by pure argon sputtering peels off, but platinum formed by this oxygen sputtering did not peel. This is thought to be due to the fact that sufficient oxygen is supplied to the high-dielectric-constant or ferroelectric material boundary as in the case of oxygen annealing shown in Embodiment 1.

This effect was more marked the higher the oxygen concentration of the sputtering atmosphere, but although adhesive properties improved with increased oxygen concentration, the deposition rate fell. A practical oxygen concentration is of the order of 5–30%, and preferably of the order of 10%.

Embodiment 3

Another effective method is to form the upper electrode 105 by CVD using a platinum complex as starting material in an oxygen atmosphere. Specifically, the platinum complex, e.g. platinum hexafluoroacetylacetone [$Pt(HFA)_2$:$Pt(CF_3COCHCOCF_3)_2$], was raised to a temperature of 50° C., and introduced into a reaction furnace with argon as carrier gas. This starting material was introduced into the reaction furnace together with oxygen.

The flowrate of carrier gas was 50 cc/min. After deposition for 3 minutes, a 100 nm thick platinum film was formed as the upper electrode 105. As the deposition of the upper electrode 105 takes place in an oxygen atmosphere, oxygen is introduced into the upper electrode (platinum)/high-dielectric-constant or ferroelectric material boundary, and the same effect is obtained as in the oxygen annealing of Embodiment 1.

Depending on the structure of the device, annealing in an oxygen atmosphere at ordinary pressure may cause undesirable oxidation of the barrier metal, such as for example with TiN.

By applying the invention to annealing under oxygen radical irradiation or annealing in an oxygen plasma, it was found that the annealing temperature could be decreased.

Embodiment 4

Next, the improvement of electrical characteristics of the capacitor due to this invention will be described in detail.

Figure 11:
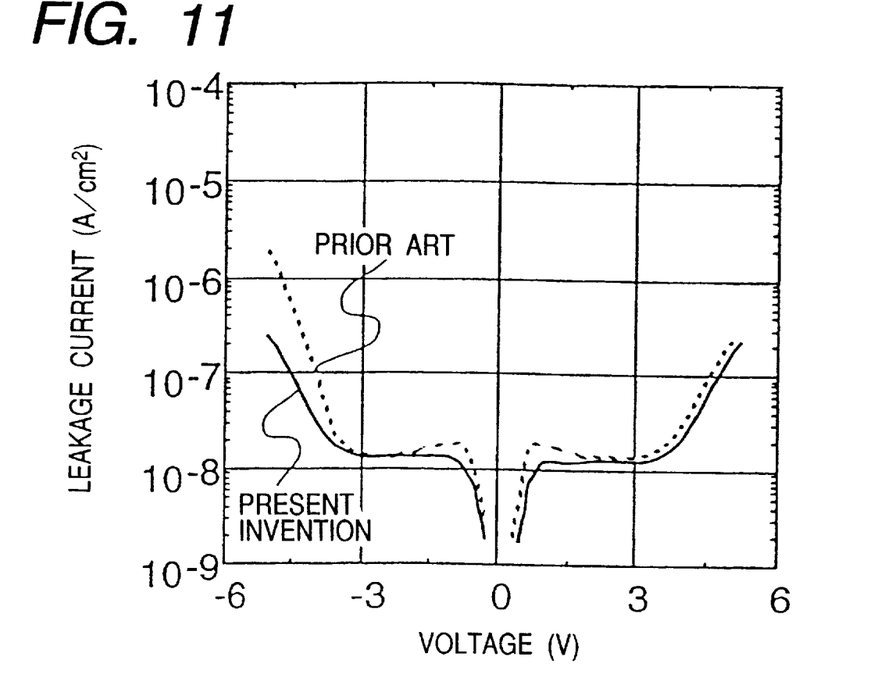
FIG. 11 is an IV characteristic diagram of a PZT capacitor obtained by oxygen treatment according to this invention.

FIG. 11 shows the current-voltage characteristics of a capacitor having the construction shown in FIG. 1 where the capacitor insulating film is 100 nm thick PZT (referred to hereafter as PZT capacitor). The voltage on the horizontal axis is the voltage of the upper electrode 105 based on the lower electrode 102.

The essential feature is the decrease of leakage current on the negative voltage side, and the breakdown voltage defined by $10^{-7}$ A/cm$^2$ is improved from $-4$V to $-4.5$V. In the current-voltage characteristics of the PZT capacitor, the current on the positive voltage side of the voltage at which current begins to flow (in FIG. 11, approx. $-4$V) is a Schottky current, and the value of the current is determined by band discontinuity in the boundary between the electrode and PZT.

In this Schottky region, decrease of the current value on the negative voltage side shows decrease of electron injection probability from the upper electrode side, i.e. increase of band discontinuity due to rapid oxidation of the upper electrode/PZT boundary. This provides the most direct illustration of the effect of introducing oxygen according to this invention.

Figure 12:
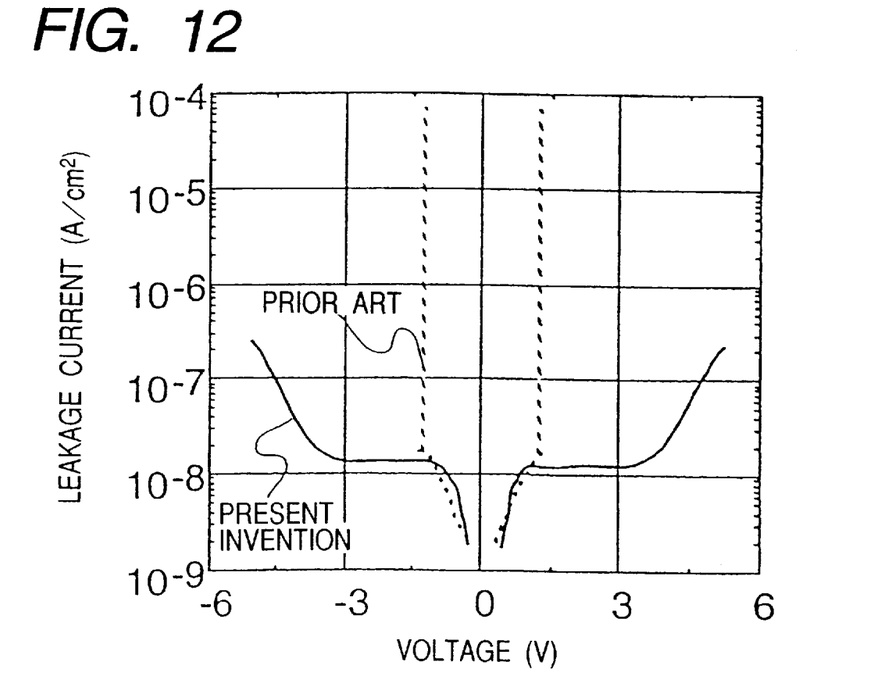
FIG. 12 is a diagram showing a comparison between this invention and the prior art of IV characteristics after passivation treatment.

FIG. 12 shows a case where SiO$_2$ was deposited by CVD from plasma decomposition of the starting material TEOS (abbreviation of tetraethoxysilane) as the passivation film 106 on this capacitor, and current-voltage characteristics were measured after removing the passivation film only on the electrode by the usual method. The plasma SiO2 film was deposited at a substrate temperature of 390° C.

In a capacitor formed by the prior art method, in addition to delamination of the upper electrode 105 which frequently occurred, insulation breakdown occurred at low voltages even when delamination did not occur as shown in the figure so practical application was impossible. On the other hand, according to this invention, delamination was prevented and there was practically no degradation of current-voltage characteristics.

Figure 13:
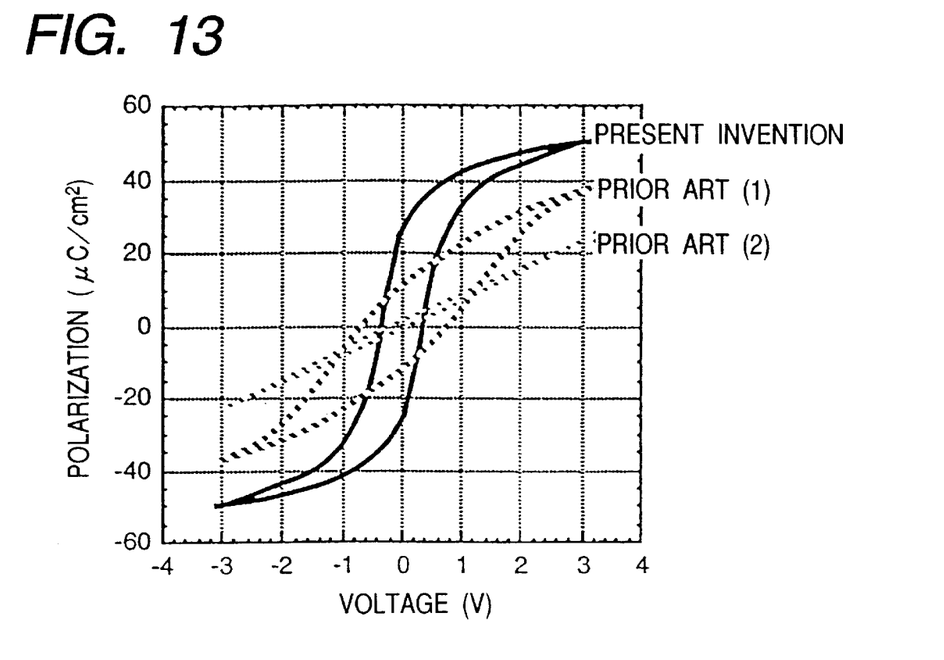
FIG. 13 is a diagram showing a comparison between this invention and the prior art of hysteresis characteristics after passivation treatment.

FIG. 13 shows electric flux density-electric field characteristics for a PZT capacitor with 100 nm film thickness. A capacitor formed by a prior art technique which is shown in the figure as a comparison [prior art method (1)] showed ferroelectricity, but the coercive electric field was high, and it was unsuitable for operation at the low voltages required for ordinary LSI semiconductor memories.

On the other hand, according to this invention, the coercive electric field was suppressed to a low value, and a capacitor showing sufficient ferroelectricity was formed even at a source voltage of 3V. Characteristics after performing passivation with TEOS by the same plasma decomposition as for current voltage-characteristics are shown in FIG. 13, prior art method (2).

Whereas a capacitor not according to this invention required increased coercive electric field and was not suitable for practical application, the capacitor according to this invention showed no change due to passivation, retained high ferroelectricity, and demonstrated adequate remnant polarization for 3V operation.

Figure 14:
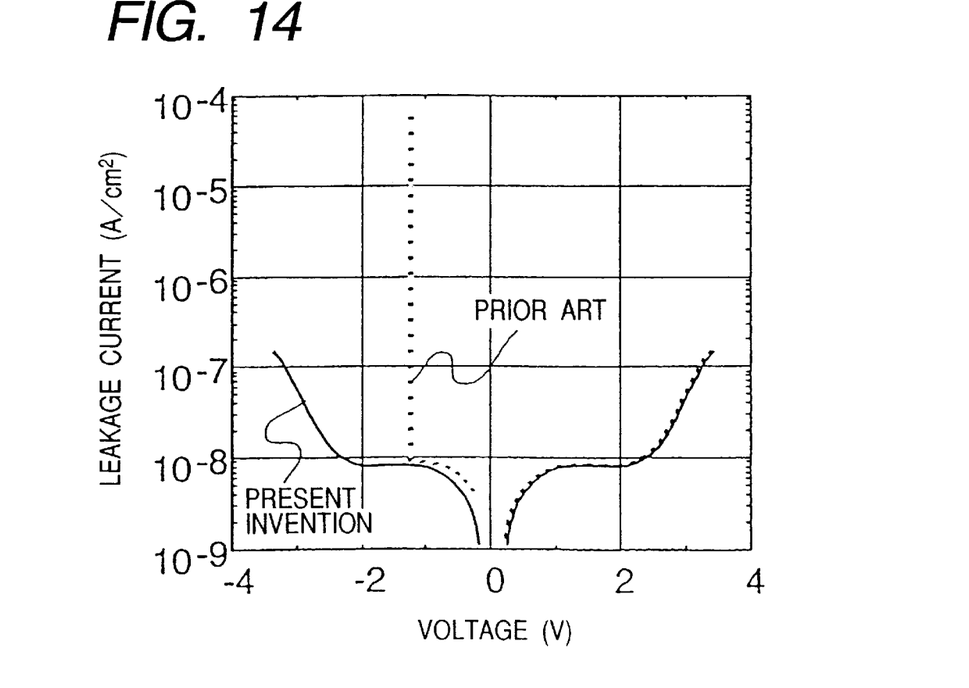
FIG. 14 is a diagram showing a comparison between this invention and the prior art of IV characteristics after passivation treatment.

Also, whereas a sharp decline of insulation breakdown voltage is observed for a prior art capacitor as shown in FIG. 14 when the plasma SiO$_2$ film 106 is formed as a passivation film on a capacitor using BST as ferroelectric material, and particularly at negative voltages, this phenomenon was not observed according to this invention.

Next, an example of a semiconductor memory fabricated using these capacitors will be given.

Embodiment 5

Figure 15:
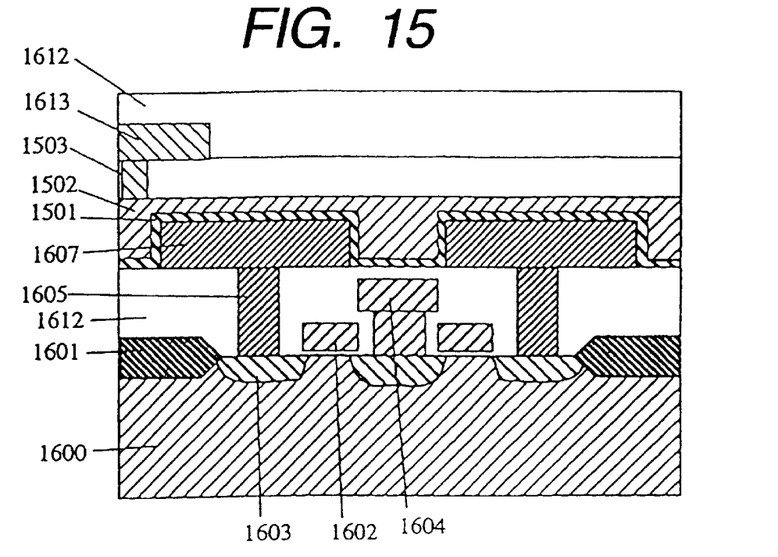
FIG. 15 is a sectional view of the structure of a DRAM using BST as a capacitor insulating film as one example of this invention.

FIG. 15 is an example of a DRAM using BST as high-dielectric-constant or ferroelectric material. The BST film thickness used here was 25 nm, the electrostatic capacitance was 80fF/$\mu$m$^2$, and the insulating critical voltage defined by $10^{-8}$ A/cm$^2$ was 2.2 volts. It was found that a DRAM using this capacitor had a reliability of 10 years.

Figure 16:
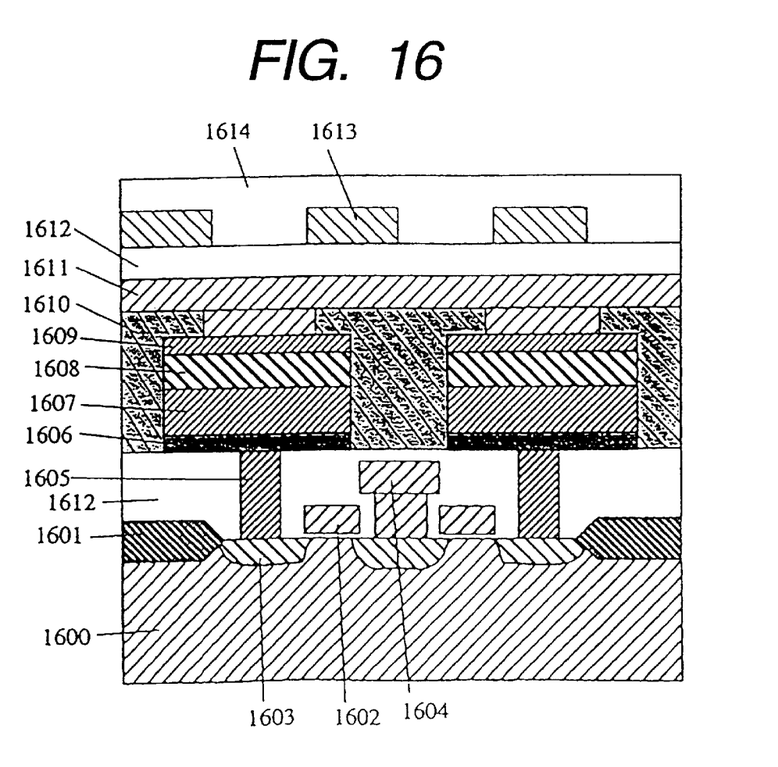
FIG. 16 is a sectional view of the structure of a DRAM using PZT as a capacitor insulating film as one example of this invention.

FIG. 16 is an example of a semiconductor memory for non-volatile operation using PZT as the high-dielectric-constant or ferroelectric material. The film thickness of PZT used here was 100 nm, the remnant polarization was 50 $\mu$C/cm$^2$ for 3V operation, and the non-remnant polarization component was 25 $\mu$C/cm$^2$.

Industrial Field of Application

As described hereabove, according to the semiconductor memory and method of manufacturing the semiconductor memory of this invention, lowering of capacitance of a capacitor, insulation failure and electrode delamination due to the formation of a passivation film (insulating film) in a plasma which can be processed at a comparatively low temperature are prevented, lowering of capacitance when an alternating electric field is applied is suppressed, and the insulation failure rate is reduced. Moreover, when a ferroelectric material is used as the ferroelectric film, the remnant polarization is increased and the coercive electric field is decreased. By providing a capacitor having these excellent characteristics, it was therefore possible to produce a non-volatile semiconductor memory of high reliability.

What is claimed is:

1. A method of manufacturing a semiconductor memory, comprising:

forming a capacitor structure by growing a high ferroelectric oxide thin film as a capacitor insulating film between a lower electrode and an upper electrode; and forming an integrated capacitor by growing a protective film covering said capacitor structure, wherein the method further comprises forming an oxygen-containing layer between a boundary of said upper electrode and said high ferroelectric oxide thin film in a region near to a surface of said high ferroelectric oxide thin film, and not in a region of said upper electrode, by introducing oxygen into the upper electrode/high ferroelectric oxide thin film boundary through said upper electrode, after forming said protective film by plasma treatment.

2. A method of manufacturing a semiconductor memory according to claim 1, wherein said forming said oxygen-containing layer between said boundary of said upper electrode and high ferroelectric oxide thin film through said upper electrode, is an annealing step in an oxygen atmosphere.

3. A method of manufacturing a semiconductor memory according to claim 2, wherein said growing said protective film covering said capacitor structure is a silicon hydride or a tetraethoxysilane plasma-assisted decomposition step.

4. A method of manufacturing a semiconductor memory according to claim 3, wherein said annealing step in an oxygen atmosphere is a step wherein annealing is performed at a temperature of 400–575° C. at atmospheric pressure for at least 10 minutes.

5. A method of manufacturing a semiconductor memory, comprising:

forming a capacitor structure by growing a high ferroelectric oxide thin film as a capacitor insulating film between a lower electrode and an upper electrode; and forming an integrated capacitor by growing a protective film covering said capacitor structure by plasma treatment, wherein the method further comprises forming a oxygen-containing layer between a boundary of said upper electrode and said high ferroelectric oxide thin film in a region near to a surface of said high ferroelectric oxide thin film and not in a region of said upper electrode, by introducing oxygen into the upper electrode/high ferroelectric oxide thin film boundary through said upper electrode after forming said upper electrode in the steps for forming said capacitor structure.

6. A method of manufacturing a semiconductor memory according to claim 5, wherein said forming said oxygen-containing layer between said boundary of said upper electrode and said high ferroelectric oxide thin film through said upper electrode, is an annealing step in an oxygen atmosphere.

7. A method of manufacturing a semiconductor memory according to claim 6, wherein said annealing step in an oxygen atmosphere is a step wherein annealing is performed at a temperature of 400–575° C. at atmospheric pressure for at least 10 minutes.

8. A method of manufacturing a semiconductor memory according to claim 5, wherein said growing said protective film covering said capacitor structure is a silicon hydride or a tetraethoxysilane plasma-assisted decomposition step.

* * * * *